(12) United States Patent
Prasad et al.

(10) Patent No.: US 12,461,304 B2
(45) Date of Patent: Nov. 4, 2025

(54) OPTICAL PACKAGING FEATURES FOR MECHANICAL STABILITY AND OPTICAL FIBER COUPLING

(71) Applicant: Cisco Technology, Inc., San Jose, CA (US)

(72) Inventors: Aparna R. Prasad, San Jose, CA (US); Norbert Schlepple, Macungie, PA (US); Vipulkumar K. Patel, Breinigsville, PA (US); Arturo Pachon Munoz, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 298 days.

(21) Appl. No.: 18/165,844

(22) Filed: Feb. 7, 2023

(65) Prior Publication Data
US 2024/0264370 A1    Aug. 8, 2024

(51) Int. Cl.
G02B 6/12      (2006.01)
G02B 6/13      (2006.01)

(52) U.S. Cl.
CPC ........... *G02B 6/12004* (2013.01); *G02B 6/13* (2013.01); *G02B 2006/12061* (2013.01)

(58) Field of Classification Search
CPC .. G02B 6/12002; G02B 6/12004; G02B 6/30; G02B 6/305; G02B 6/42; G02B 6/4202; G02B 6/43
See application file for complete search history.

(56) References Cited

U.S. PATENT DOCUMENTS

| | | |
|---|---|---|
| 9,995,881 B1 | 6/2018 | Patel et al. |
| 2005/0110168 A1* | 5/2005 | Chuang ............... H01L 23/06 |
| | | 438/126 |
| 2017/0117214 A1* | 4/2017 | Park ................ H01L 23/482 |
| 2017/0131476 A1 | 5/2017 | Gambino et al. |
| 2018/0366399 A1* | 12/2018 | Pietambaram ......... H01L 23/28 |
| 2019/0137706 A1 | 5/2019 | Xie |
| 2019/0285804 A1 | 9/2019 | Ramachandran et al. |
| 2019/0317287 A1* | 10/2019 | Raghunathan ......... G02B 6/426 |
| 2019/0324223 A1* | 10/2019 | Yim ................ H04B 10/60 |
| 2020/0152574 A1 | 5/2020 | Ding et al. |
| 2021/0132309 A1* | 5/2021 | Zhang ................ G02B 6/4249 |
| 2022/0043222 A1 | 2/2022 | Novack |
| 2022/0342150 A1* | 10/2022 | Karhade ............. G02B 6/4204 |
| 2022/0342165 A1* | 10/2022 | Wilkerson ............ G02B 6/425 |
| 2022/0365274 A1* | 11/2022 | Huang .................. G02B 6/13 |
| 2024/0128146 A1* | 4/2024 | Tong ................ H01L 23/3672 |
| 2024/0192439 A1* | 6/2024 | Janta-Polczynski ..... G02B 6/43 |

* cited by examiner

Primary Examiner — Michael Stahl
(74) Attorney, Agent, or Firm — Patterson + Sheridan, LLP

(57) ABSTRACT

An optical package with increased mechanical stability of co-packaged optic components is described. The optical package includes an electronic mold compound (EMC) layer with copper pillars formed through the EMC layer. The optical package also includes a silicon interposer layer with through silicon vias (TSVs) and positioned on the EMC layer. A combined thickness of the EMC layer and the silicon interposer layer provide a combined mechanical coupling thickness for a connection component on a smooth diced edge side of the EMC layer and the silicon interposer layer. The optical package also includes devices attached to the silicon interposer layer.

19 Claims, 20 Drawing Sheets

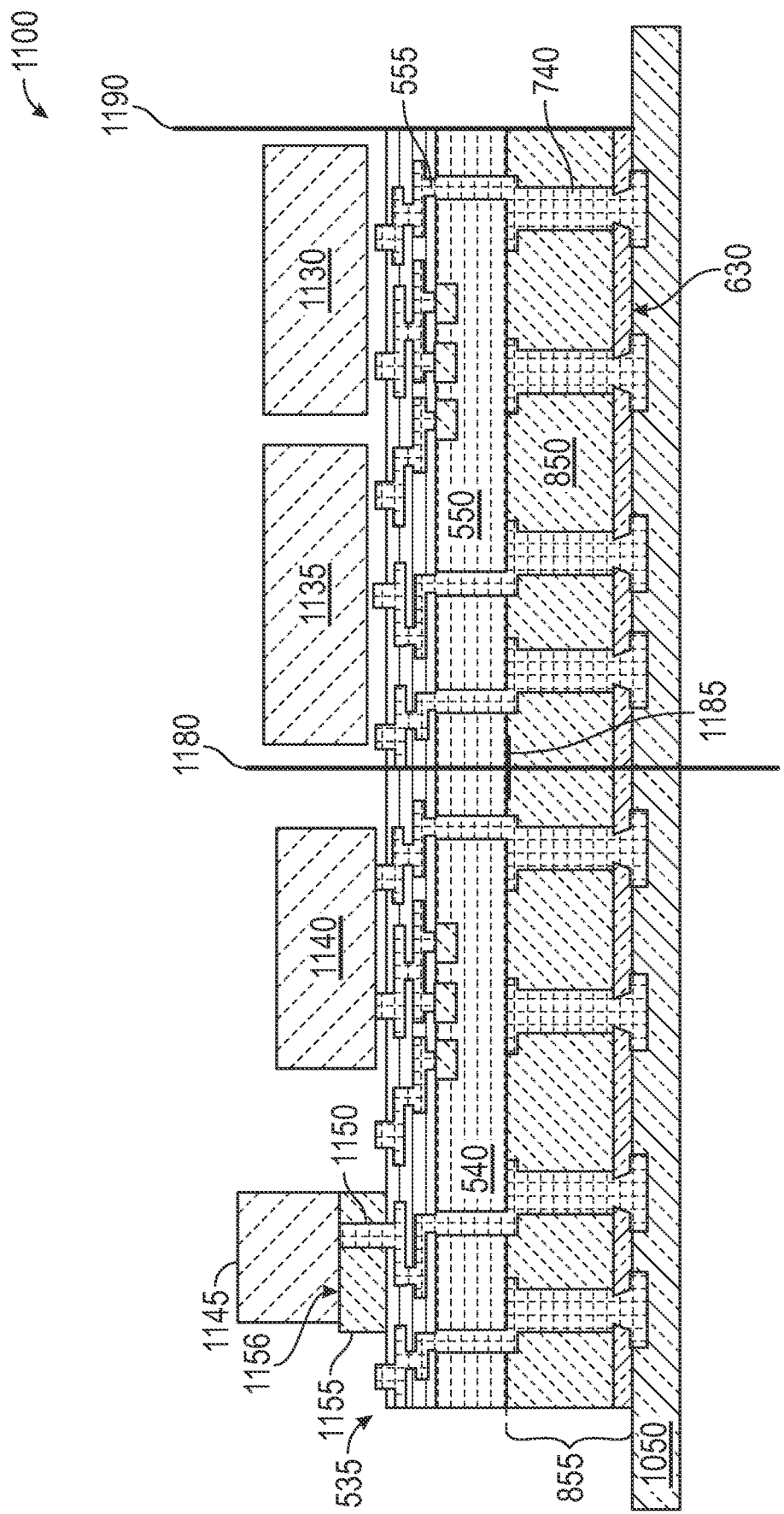

OPTICAL PACKAGING FEATURES FOR MECHANICAL STABILITY AND OPTICAL FIBER COUPLING

Embodiments presented in this disclosure generally relate to optical packages which connect various optical, electronic, and optoelectronic devices. More specifically, embodiments disclosed herein describe an optical package with a silicon interposer layer and an electronic mold compound (EMC) layer which together provide a mechanically stable optical package for attached devices.

BACKGROUND

Optical packages in optical communication systems provide a variety of functions, including providing a support structure for attached devices as well as providing a communication interface for the attached devices and external optical signals via connected optical fibers. Increasing development related to Co-packaged optics (CPO) or In-package optics (IPO) offers increased speed and performance for various electronic integrated circuits (EICs) and photonic IC (PICs) located on a single CPO package. However, the development of these advanced CPO increases the demand for various additional components to be located on the optical package as well as increases a size of associated input/output (I/O) components. Traditional optical packages using wire bonding and basic support structures do not provide a mechanically stable or efficient optical package for these advanced CPO components.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 10A-10B, 11A-11C, 12, 13, and 14 illustrate various views of an example fabrication process for an optical package, according to embodiments disclosed herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
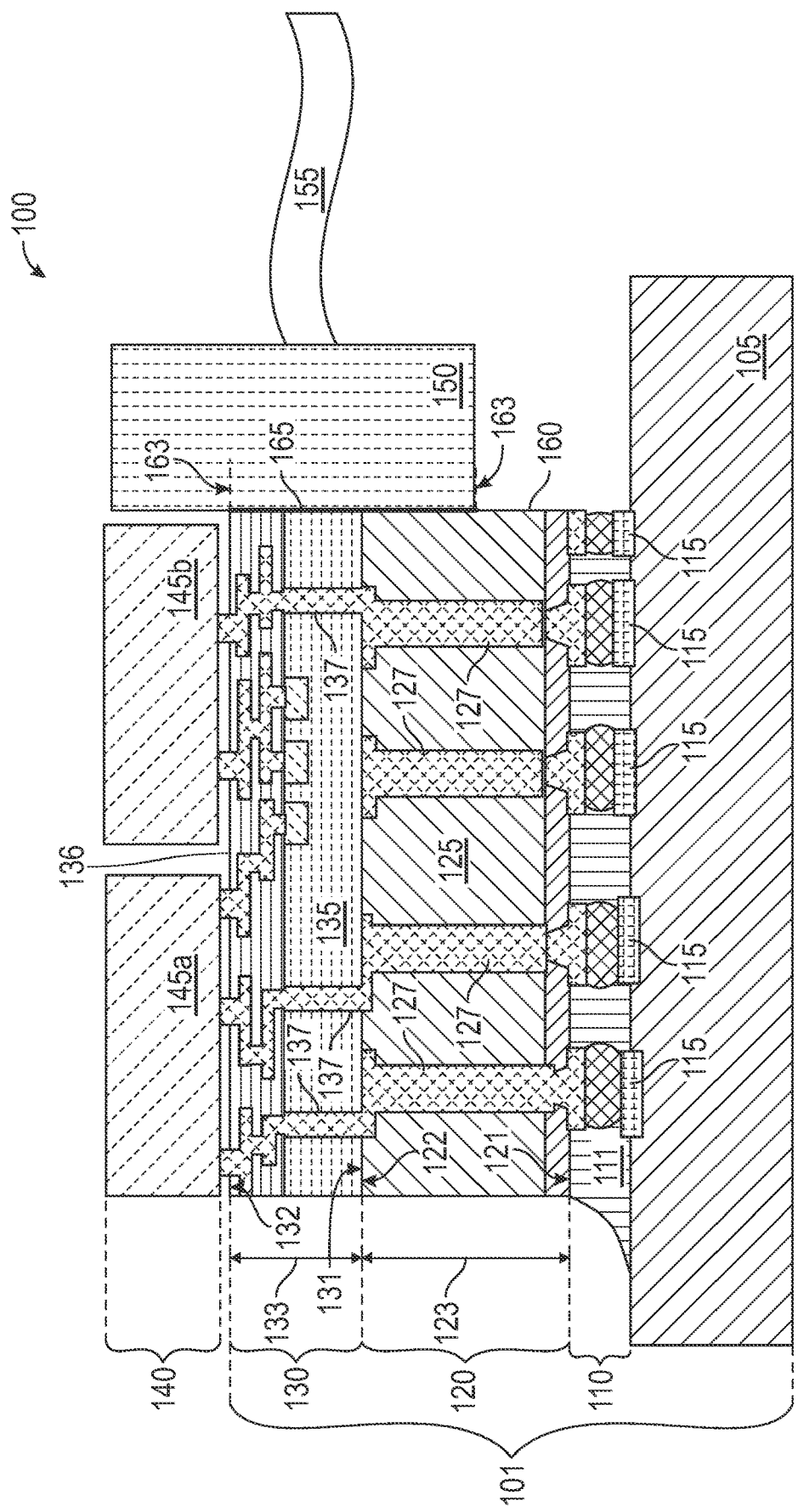
FIG. 1 illustrates a cross-section view of an optical package, according to one embodiment disclosed herein.

One example embodiment includes an optical platform. The optical platform includes a first layer positioned on a substrate with a first thickness from a first side of the first layer adjacent to the substrate to a second side of the first layer and a first plurality of conductive paths formed in the first layer. The optical platform also includes a second layer positioned on the first layer and may include a second thickness from a first side of the second layer adjacent to the second side of the first layer to a second side of the second layer, where the first thickness is greater than the second thickness, and where the first thickness and the second thickness provide a combined mechanical coupling thickness for an optical connection component on an facet edge side of the first layer and the second layer. The optical platform also includes a second plurality of conductive paths formed through the second layer, where the second plurality of conductive paths provides communication paths from the second side of the second layer to the first plurality of conductive paths.

One example embodiment includes a method. The method includes processing a silicon layer on a wafer to form a interposer layer for an optical package, where the interposer layer may include a first plurality of conductive paths, where the interposer layer may include a first thickness between a first side of the interposer layer and a second side of the interposer layer, forming a second plurality of conductive paths on the second side of the interposer layer, and dispensing an electronic mold compound (EMC) on the second side of the interposer layer and around the second plurality of conductive paths to form a EMC layer on the wafer, where the EMC layer may include a second thickness between a first side of the EMC layer and a second side of the EMC layer. The method also includes dicing the wafer to form an optical package unit may include a diced smooth facet surface for optical component connection.

One example embodiment includes an optical package. The optical package includes an electronic mold compound (EMC) layer positioned on a substrate and may include a first thickness from a first side of the EMC layer adjacent to the substrate to a second side of the EMC layer, a plurality of conductive pillars formed through the EMC layer, a silicon interposer layer positioned on the EMC layer and may include a second thickness from a first side of the silicon interposer layer adjacent to the second side of the EMC layer to a second side of the silicon interposer layer. The package also includes at least one optical device attached to the silicon interposer layer, and a plurality of TSVs formed through the silicon interposer layer, where the plurality of TSVs provides communication paths through the optical package for the at least one optical device.

Example Embodiments

As described above, optical communication systems are increasingly utilizing CPO packages to provide for increased performance in the optical communication systems with lower power requirements. The use of CPO in optical packages presents several challenges. For example, CPO components increase a demand for interconnects between the various devices/components in the optical package. In some examples, wire bonding provides links from electrical chips (e.g., EICs) to substrates of the optical package (e.g., an organic substrate, printed circuit board (PCB), etc.). However, wire bonding may also present signal integrity issues in optical packages and also demands a large amount of space on the package such that the use of the wire bonding limits a number of CPO devices in the package.

Additionally, CPO devices often demand increased capacity communication components. For example, application specific ICs (ASICs), optical engines, and other similar CPO components use large scale I/O components to function at a maximum designed ability. For example, instead of a single fiber coupled to the optical package, a fiber array unit (FAU) with an interface for multiple fibers may be used for the CPO components and optical package to function at a maximum performance. In some examples, an optical package that includes an interposer on a substrate does not provide sufficient mechanical stability for an FAU to be attached to the package or a large number of CPO devices to be implemented in the package.

The optical platform and packages described herein include multiple layers where the layers increase the size and mechanical stability of the optical platform and related external optical connections. The layers include a silicon interposer layer (e.g., a Silicon Photonic Integrated Circuit (SiPH)) which provides for increased signal integrity between the components of the optical platform and external optical connections. The layers also include an EMC layer which provides the mechanical stability for the optical platform and provides additional connection surface for external optical connections. The optical platform and packages are described in more detail in relation to FIGS. 1 and 2 and in the fabrication operations described in relation to FIGS. 3-14 herein.

FIG. 1 illustrates a cross-section view of an optical package, according to one embodiment disclosed herein. Optical package 100 includes an optical platform 101. The optical platform 101 includes a substrate 105 and a first layer 120 positioned on the substrate 105. In some examples, the first layer 120 is connected to the substrate 105 via a connection layer 110. The connection layer 110 includes interconnects 115 such as contacts and solder bumps to connect the first layer 120 to the substrate 105. In some examples, the connection layer 110 also includes underfill material 111 formed about or around the interconnects 115.

In some examples, the first layer 120 has an associated a first thickness 123 from a first side 121 of the first layer 120 adjacent to the substrate 105 to a second side 122 of the first layer 120. In some examples, the first layer includes a first plurality of conductive paths 127 formed in the first layer. The first layer 120 may be formed with an EMC 125 and the first plurality of conductive paths 127 are a plurality of copper pillars in the EMC 125. In some examples, the first thickness 123 is approximately 200-400 microns and the copper pillars have a height of similar value to the thickness of the first layer 120 in order to completely pass through the first layer 120.

The optical platform 101 also includes a second layer 130 positioned on the first layer 120. The second layer 130 has a second thickness 133 from a first side 131 of the second layer adjacent to the second side 122 of the first layer 120 to a second side 132 of the second layer 130. In some examples, the first thickness 123 of the first layer 120 is at least 2 times larger than the second thickness. For example, the first thickness 123 may be approximately 200-400 microns and the second thickness 133 may be approximately 100 microns.

The second layer 130 includes a second plurality of conductive paths 137 formed through the second layer 130. In some examples, the second layer 130 is a silicon interposer or SiPH formed with silicon waveguide layer 135 and a metal layer 136. In some examples, the second plurality of conductive paths 137 include through silicon vias (TSVs) formed through the silicon waveguide layer 135 and a metal layer 136. The second plurality of conductive paths 137 provides a communication path(s) from the second side 132 of the second layer 130 to the first plurality of conductive paths 127.

In some examples, the optical platform 101 serves as the optical platform and optical connection device for CPO devices in the optical package 100. For example, the optical package 100 includes at least one device in a device layer 140, such as devices 145a and 145b, positioned on the second side 132 of the second layer 130. In some examples, the devices 145a and 145b are communicatively coupled to at least one path of the second plurality of conductive paths 137.

Returning back to the optical platform 101, in some examples, the EMC 125 has a first coefficient of thermal expansion (CTE) which is similar to the CTE of silicon, such as the silicon 135 or other material of the second layer 130. In some examples, the CTE similarity prevents warpage of the optical platform 101 and the optical package 100 during fabrication and use of the various devices in the optical package 100. In some examples, the filler content level of the EMC provides mechanical stability to the optical platform 101 and the optical package 100.

For example, the second layer 130 individually is generally fragile and subject to potential warpage and breakage during fabrication and use of the optical package. For example, to form TSVs in silicon a high aspect ratio is used and the typical thickness of the silicon thickness ranges from 100-150 microns, which is then filled with the conductive material of the TSVs. Since the thickness of the second layer 130 relatively thin, its ability to support the heavy design of an FAU or additional CPO components adds mechanical stress on the assembled optical package. The addition of the first layer 120 and the EMC 125 reduces the fragility of the second layer 130 and prevents warpage and breakage of the second layer 130 and the optical package 100.

Additionally, the first thickness 123 and the second thickness 133 provide a combined mechanical coupling thickness 163 for a connection component 150 on an edge side 160 of the first layer 120 and the second layer 130. In some examples, the edge side 160 is a connection side with a diced smooth facet surface formed via the operation described in relation to FIG. 3 herein. In some examples, the connection component 150 is a FAU removably attached to the edge side 160 to form a connection 165. The connection component 150 is communicatively coupled to the second layer 130 via the connection 165. The connection 165 provides communication between the second layer 130, devices 145a and 145b to external devices via the connection component 150 and connected optical fibers 155.

Figure 2:
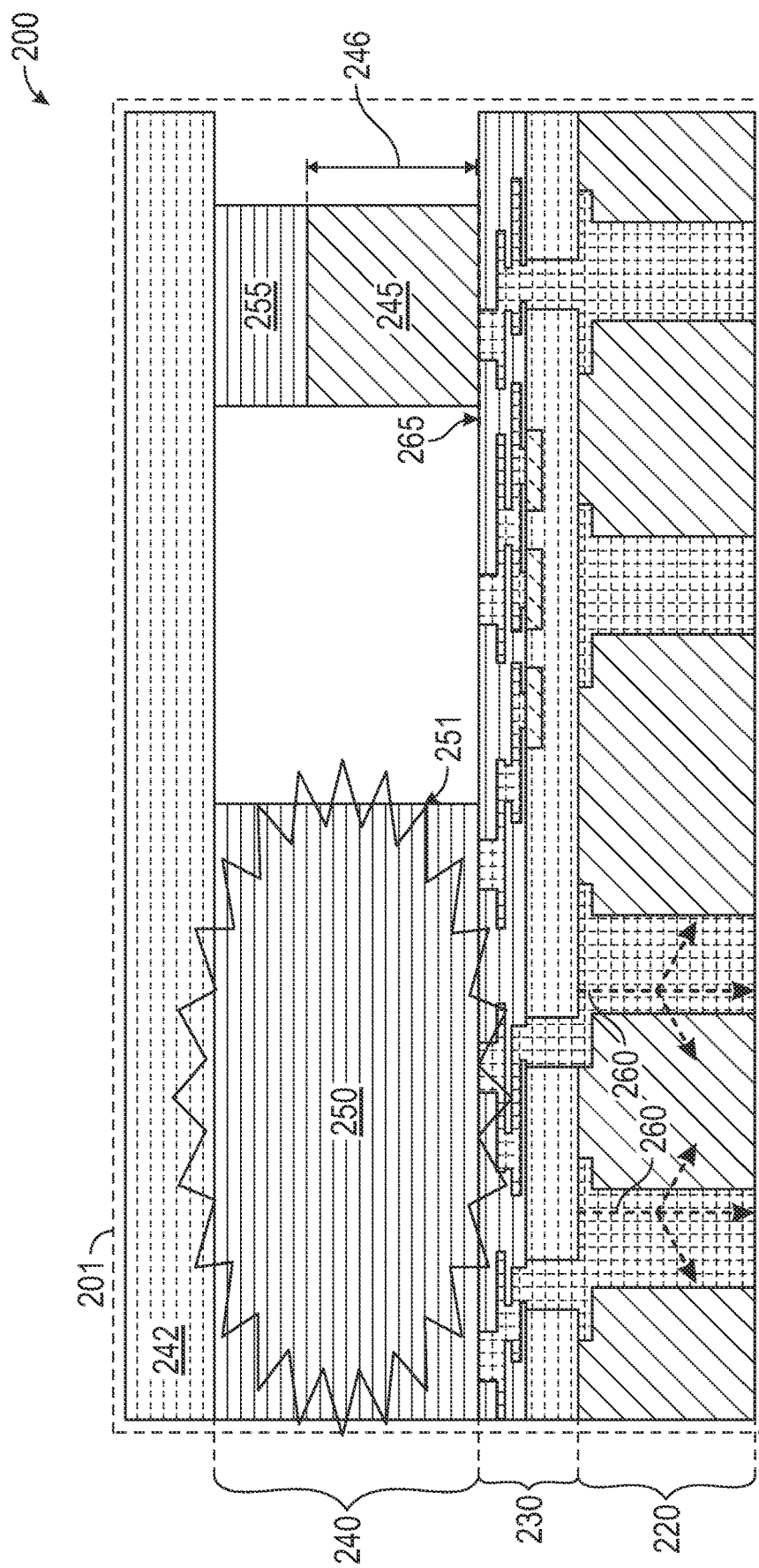
FIG. 2 illustrates a cross-section view of thermal profiles of an optical package, according to one embodiment disclosed herein.

In some examples, the first layer 120 and the first plurality of conductive paths 127 also provides a thermal dissipation for heat generated by the device layer 140 and the second layer 130 as shown in more detail in relation to FIG. 2.

FIG. 2 illustrates a cross-section view of thermal profiles of an optical package, according to one embodiment disclosed herein. In some examples, view 201 is a zoomed cross-section view of an optical package 200. In some examples the optical package 200 is similar to the optical package 100 described in relation to FIG. 1 and includes first layer 220, second layer 230, and device layer 240. The optical package 200 also includes a heatsink 242 which provides heat mitigation for the optical package 200. The device layer 240 includes a device 250 and a device 255 in the optical package 200. In some examples, the device 250 and 255 are CPO components/devices, such as EICs, ASICs, laser packages, or other CPO components.

In some examples, the second layer 230 (and the device 250) produce large amounts of thermal energy such as heat 251 from the device 250. The heat may affect the function of other devices in the optical package 200, including the device 255 as well as other components (e.g. a connected FAU, etc.). The first layer 220 including associated communication channels (e.g., copper pillars such as shown in FIG. 1) in the first layer 220 provide heat dissipation 260 for the heat 251.

Additionally, an additional EMC layer may be utilized to provide a thermal barrier. For example, the optical package 200 may include a third layer 245 positioned on the second layer 230 with a third thickness 246 similar to the first thickness 123 in FIG. 1. The third layer 245 also includes a third plurality of conductive paths (not shown in FIG. 2) formed through the third layer in a similar manner to the first plurality of conductive paths 127 in FIG. 1. The device 255 is positioned on the third layer 245 and communicates with the second layer 230 via the third plurality of conductive paths. In some examples, the third layer 245 provides a thermal barrier 265 between the device 255 and the second layer 230, where the heat 251 dissipates through or otherwise does not pass through the third layer 245 to the device 255.

The mechanical stability of the optical package 100 described in FIG. 1 and the advantageous thermal dissipation described in relation to optical package 200 of FIG. 2 may be accomplished in any optical package with layers similar to the optical packages 100 and 200. In some examples, the optical packages 100 and 200 are fabricated to provide the layers as in the optical packages as described in relation to FIG. 3.

Figure 3:
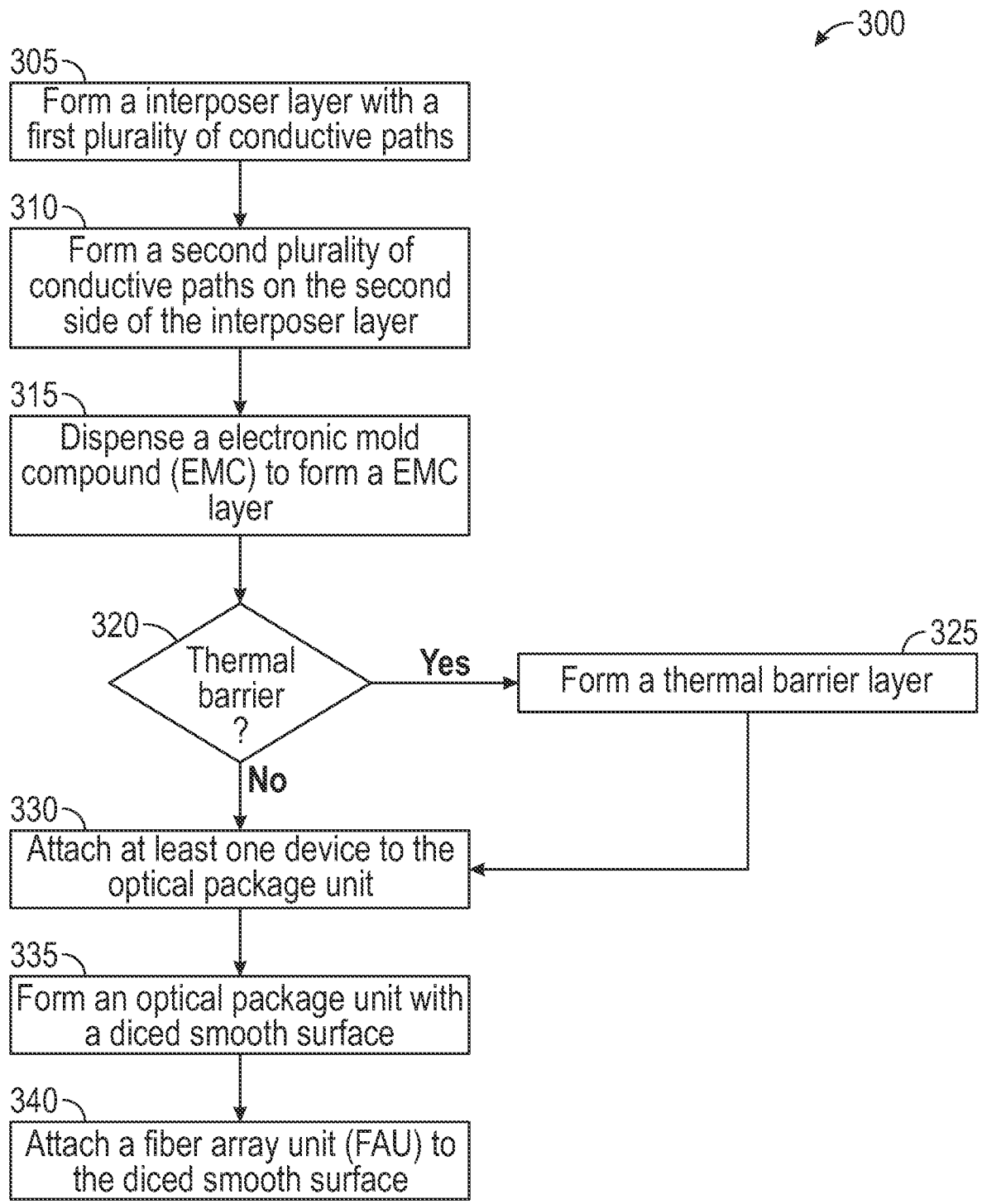
FIG. 3 is a flowchart illustrating operations for fabricating an optical package, according to one embodiment disclosed herein.

FIG. 3 is a flowchart illustrating operations for fabricating an optical package, according to one embodiment disclosed herein. The operations may be implemented by a fabricator system to form the optical package discussed above in FIGS. 1 and 2. Additionally, in the discussion of method 300 reference will be made to the steps of fabrication in FIGS. 4A-14 and previous FIGS. 1 and 2.

Figure 4A:
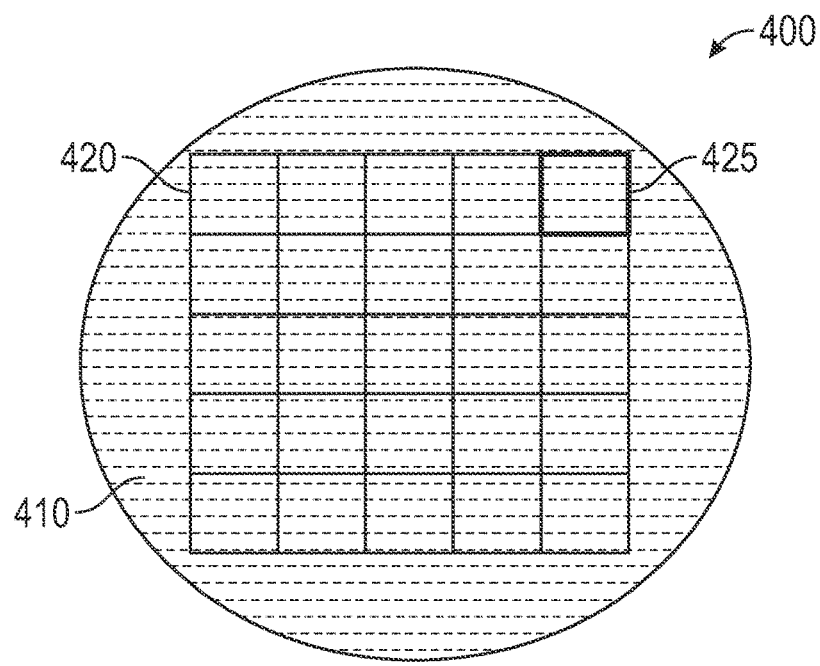
FIGS. 4A-4C, 5A-5C, 6A-6C, 7A-7C, 8A-8C, and 9A-9C illustrate various views of an example fabrication process for an optical package, according to embodiments disclosed herein.
Figure 4B:
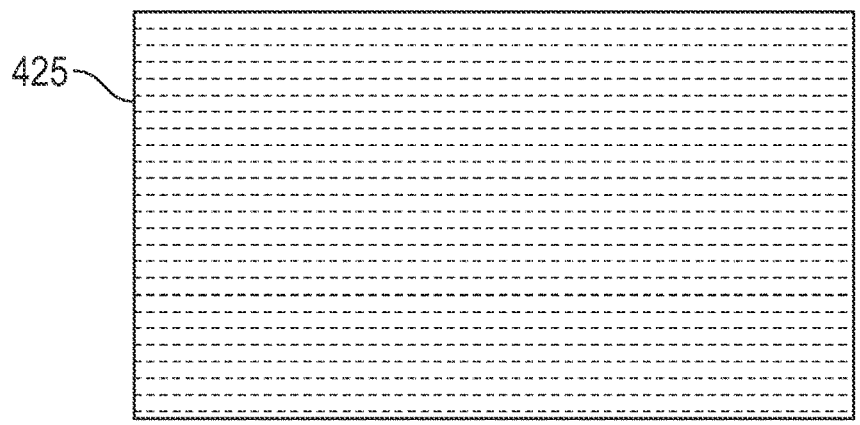
Figure 4C:

Method 300 begins at block 305, where a fabrication system forms or otherwise selects a wafer including a silicon layer and processes the silicon layer on the wafer to form an interposer layer for an optical package. For example, as shown in step 400 of FIG. 4A-4C the fabrication system forms or selects a wafer 410. FIG. 4A shows a top view of the wafer 410. In some examples, the wafer 410 is a silicon wafer and includes individual dies such as dies 420, where the dies 420 provides a plurality of base structures for forming optical platforms or optical package units. For example, the dies 420 include a die 425. FIG. 4B shows a top view of the die 425 and FIG. 4C shows a side view of the die 425. In some examples, the operations described herein are shown in relation to one die of the dies 420, but may be performed on each of the dies in the dies 420.

Figure 5A:
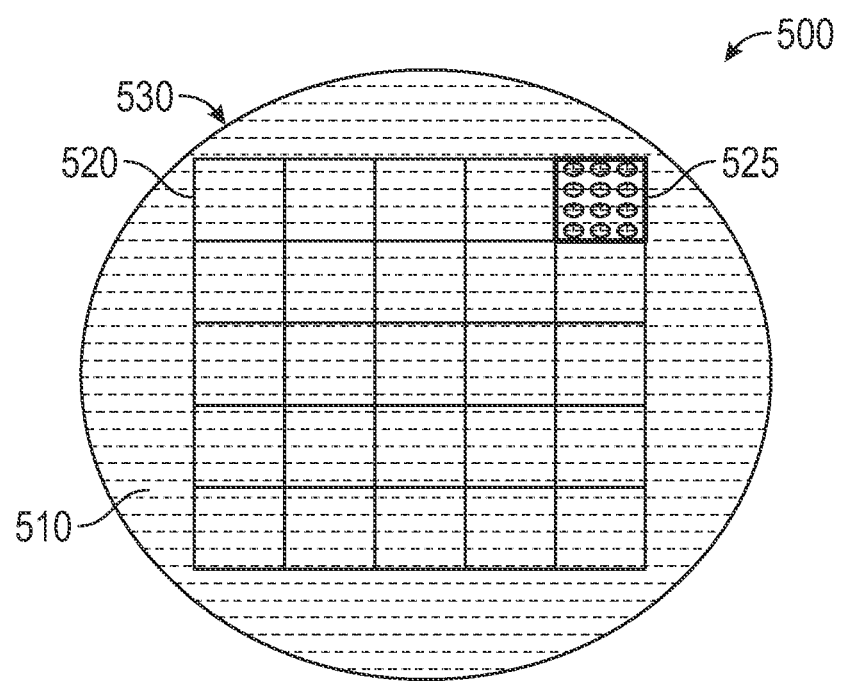
Figure 5B:
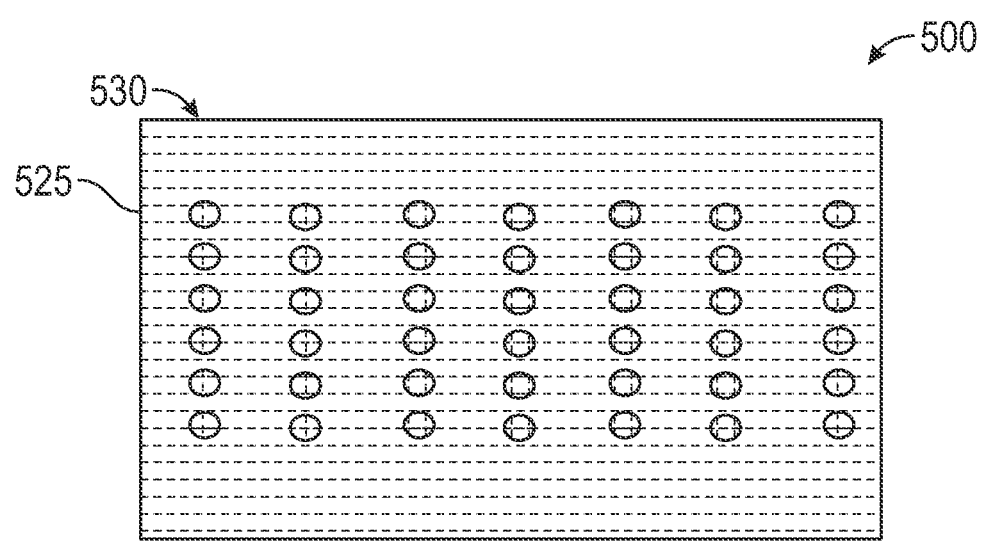
Figure 5C:
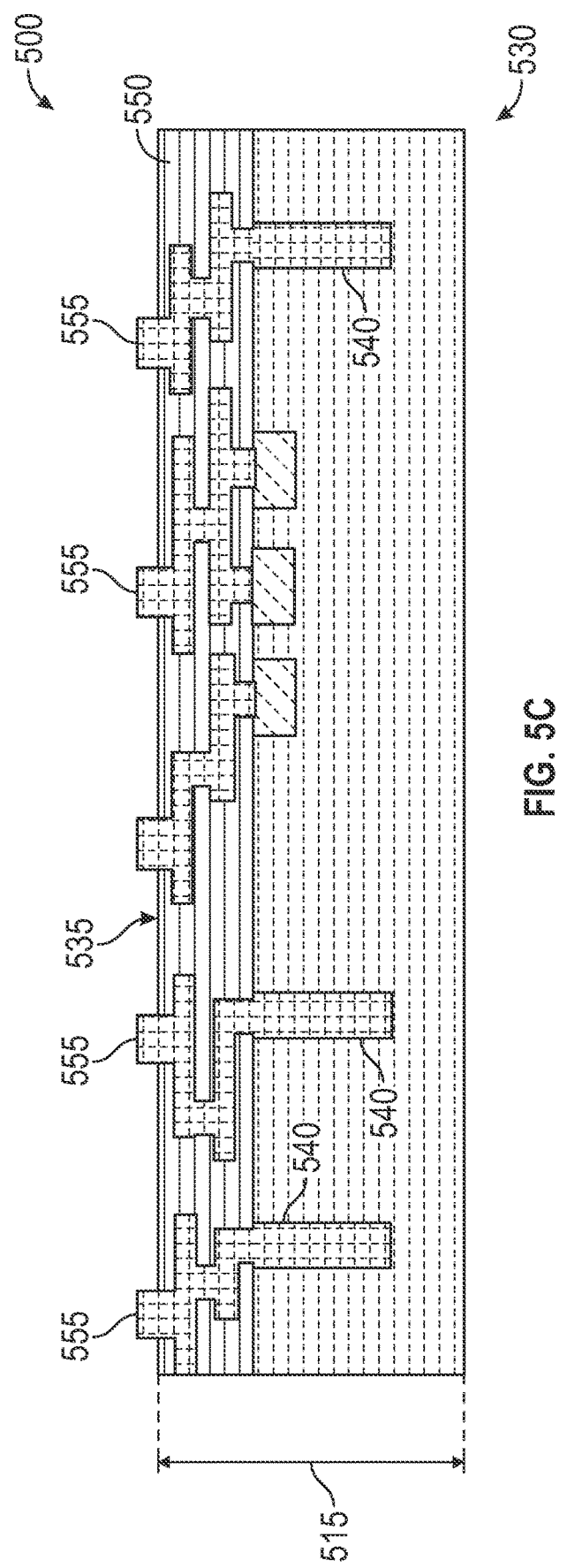

At step 500, in FIGS. 5A-5C, the fabrication system forms an interposer layer for an optical package. FIG. 5A is a top view of the wafer 410, FIG. 5B, is a top view of a die 425, and FIG. 5C is a side view of the die 525. In some examples, the fabrication system processes the wafer 410 to produce wafer 510 with interposer dies, such as dies 520. The dies 520 includes the die 525. In some examples, the die 525 is an interposer layer for an optical platform and includes a first plurality of conductive paths. For example, the die 525 includes TSVs 540 formed through the silicon of the die 525.

In some examples, the interposer layer, i.e. the die 525, includes a thickness 515 between a first side 535 of the die 525 and a second side 530 of the die 525. In some examples, the thickness 515 is approximately 100 microns or other similar thickness typical for silicon interposer layers. In some examples, the fabrication system forms the plurality of TSVs in the silicon layer and processes the silicon layer using back-end-of-line processes to form microbump interconnects on a first side of the interposer layer.

For example, the fabricator processes the wafer 510 using back-end-of-line processes to form the interconnects 555 on or extending from the TSVs 540 to the first side 535. In some examples, the interconnects 555 include microbumps and other structures to connect devices (e.g. CPO components, etc.) to an optical platform. The fabricator may also process the wafer to further form the TSVs 540 as shown in FIGS. 6A-6C.

Figure 6A:
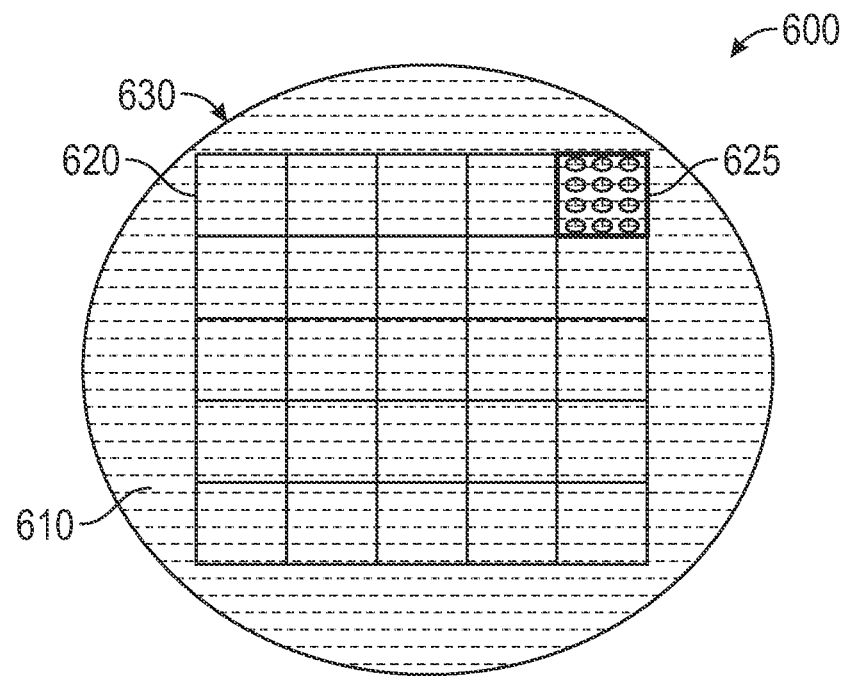
Figure 6B:
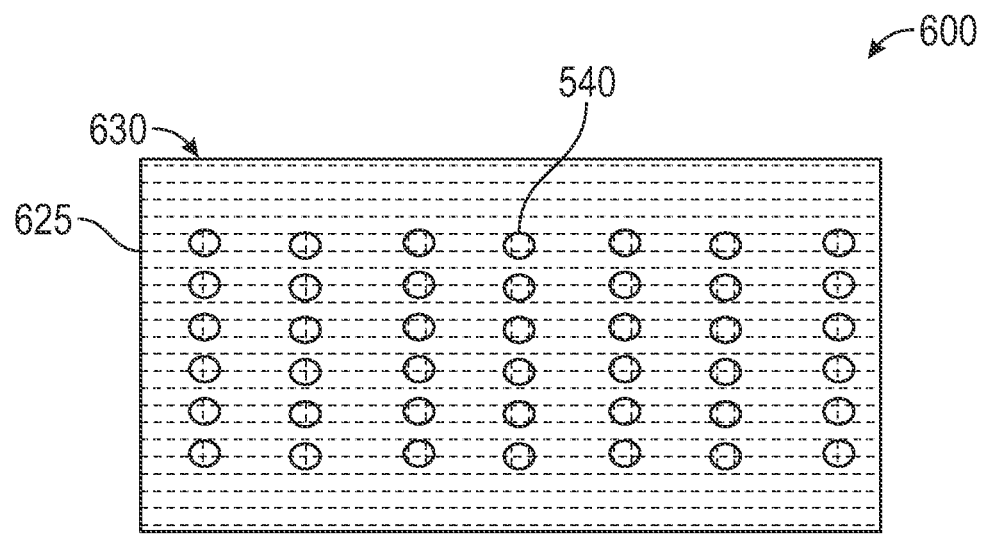
Figure 6C:
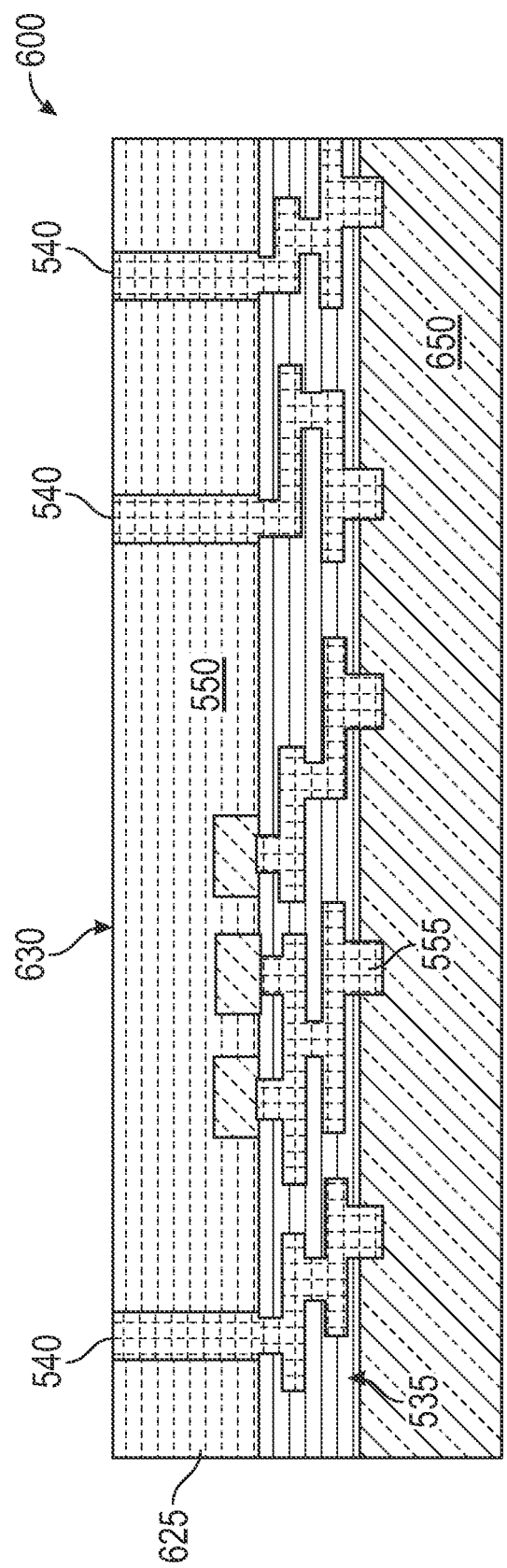

At step 600, in FIGS. 6A-6C, the fabrication system attaches the wafer 610 to a carrier wafer 650. FIG. 6A is a top view of the wafer 610, FIG. 6B, is a top view of a die 625, and FIG. 6C is a side view of the die 625. In some examples, the fabrication system attaches the wafer 610 to the carrier wafer 650 to produce the wafer 610 with dies 620. The dies 620 includes the die 625. In some examples, the fabrication system grinds/back-grinds the second side 530 of the wafer 510 to reveal the TSVs 540 on a side 630 of the wafer 610.

Figure 7A:
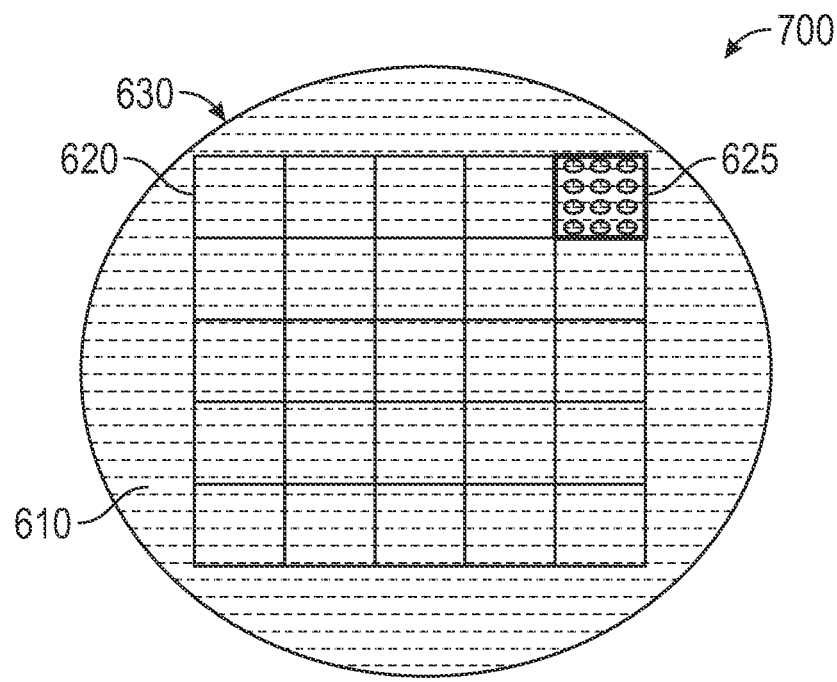
Figure 7B:
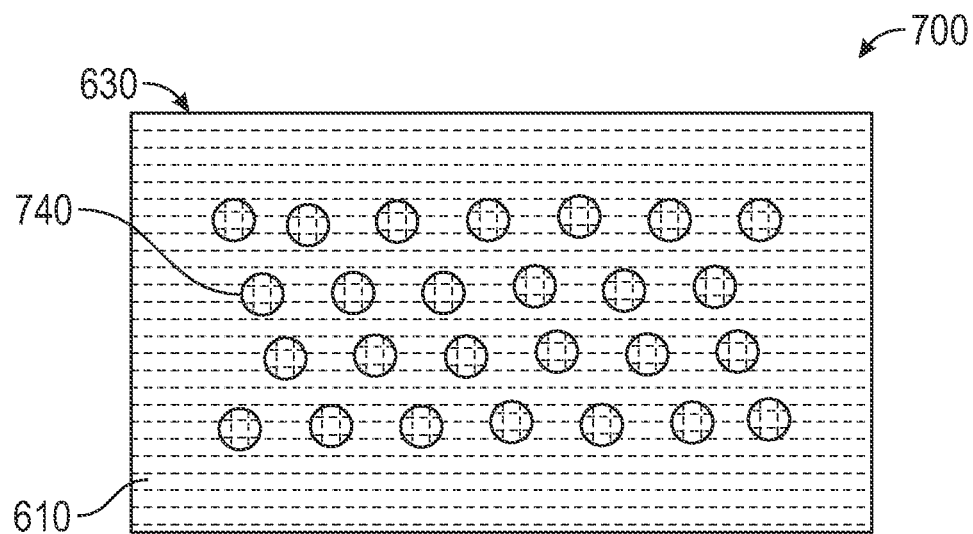
Figure 7C:
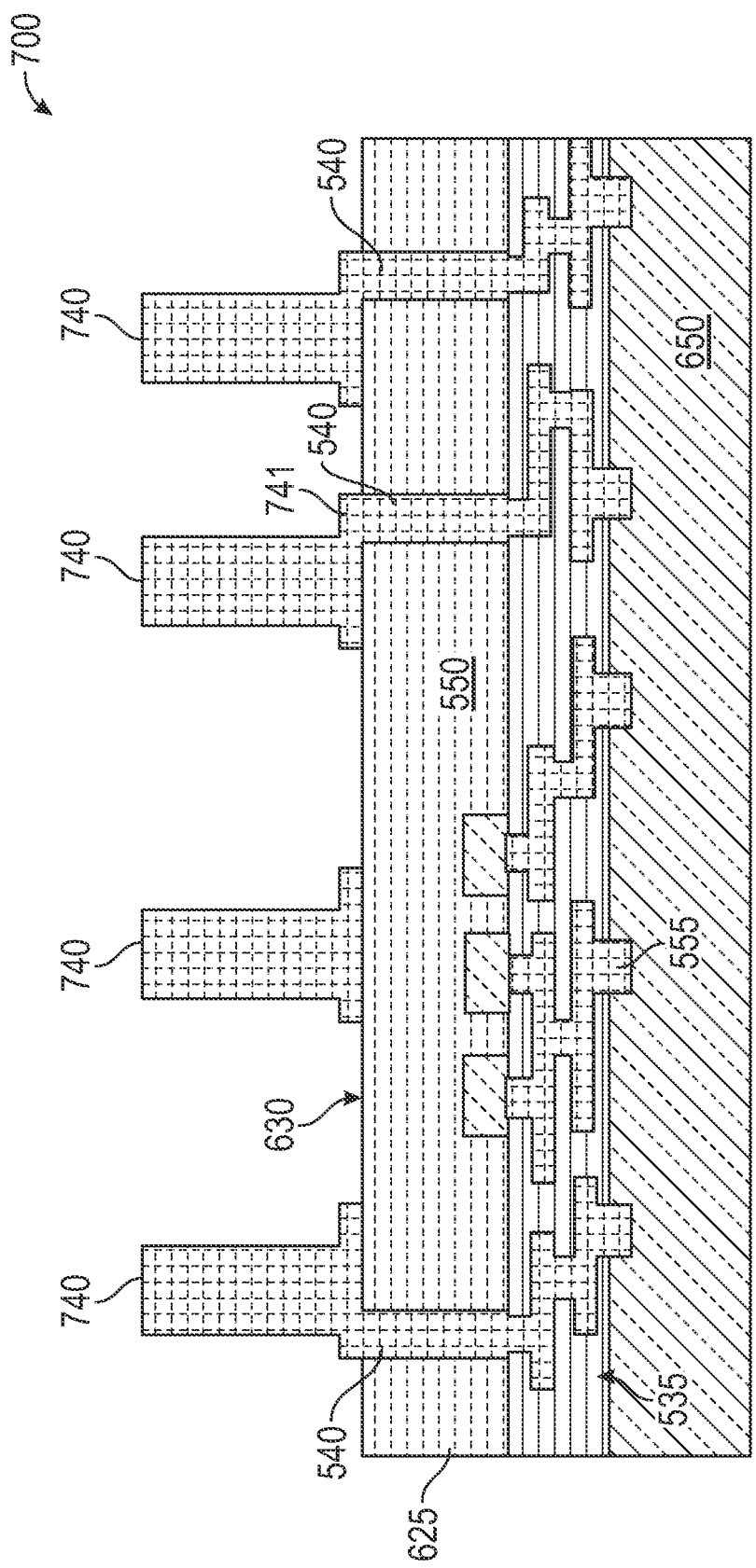

Returning back to FIG. 3, at block 310 of the method 300, the fabrication system forms a second plurality of conductive paths on the second side of the interposer layer. In some examples, the second plurality of conductive paths includes a plurality of copper pillars. The fabricator forms the plurality of copper pillars using tall copper plating processes as shown in step 700 shown in FIGS. 7A-C. FIG. 7A is a top view of the wafer 610, FIG. 7B, is a top view of a die 625, and FIG. 7C is a side view of the die 625. As shown in FIG. 7C, copper pillars 740 are grown on respective TSVs of the TSVs 540 on the side 630. In some examples, the copper pillars 740 have a similar diameter as that of the TSVs 540. In some examples, the diameter of the copper pillars 740 may be different from the diameter of the TSVs 540 and range from approximately 30 microns to 130 microns. In some examples, the copper pillars 740 may be offset from the TSVs 540 through redistribution layer (RDL) routing 741.

Figure 8A:
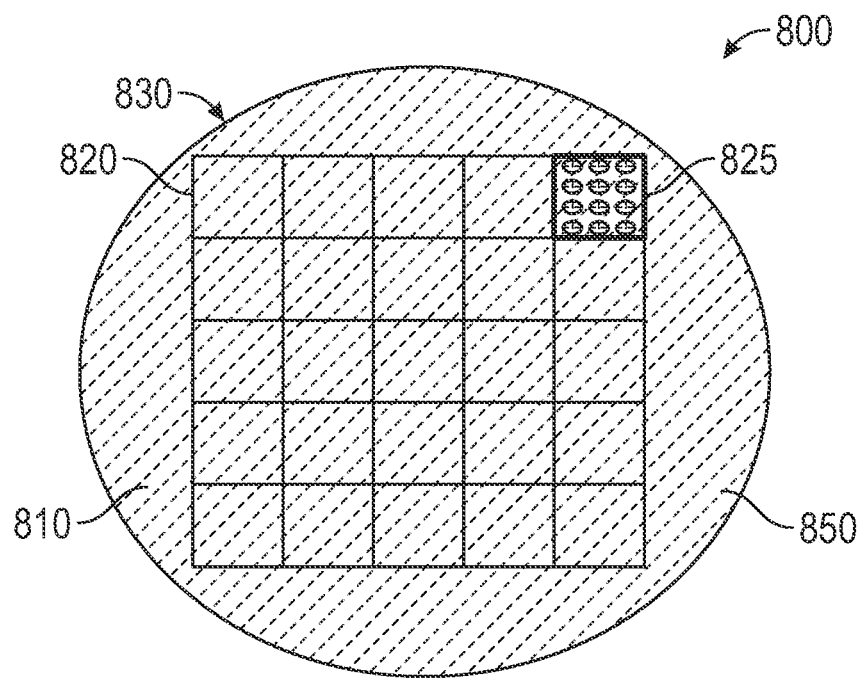
Figure 8B:
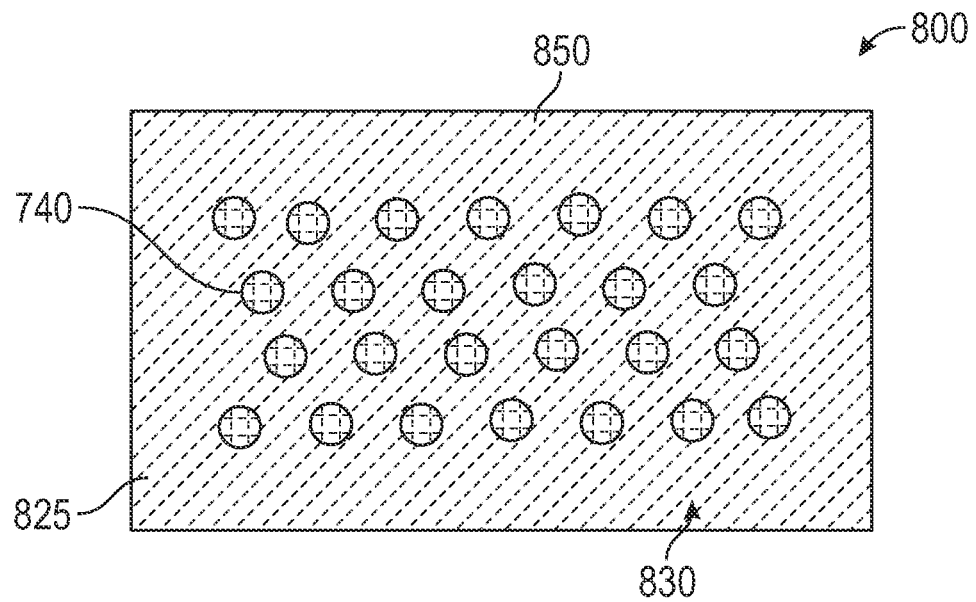
Figure 8C:
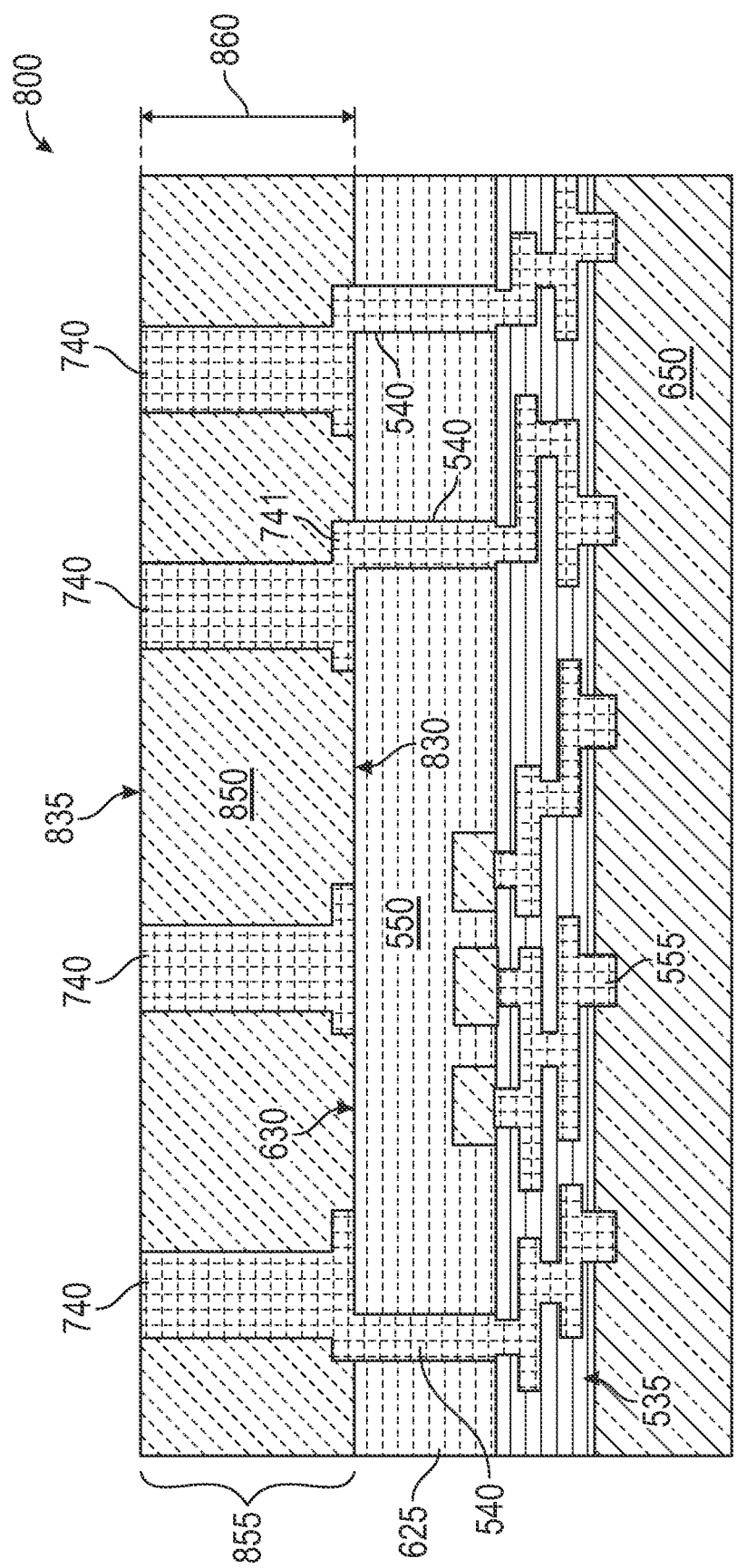

At block 315 of the method 300, the fabrication system dispenses an EMC on the second side of the interposer layer and about the second plurality of conductive paths. For example, as shown in step 800 in FIGS. 7A-C, the fabrication system dispenses an EMC 850 on the side 630 of the wafer 610 and about the copper pillars 740 to form an EMC layer on the wafer forming the wafer 810. FIG. 8A is a top view of the wafer 810, FIG. 8B is a top view of a die 825, and FIG. 8C is a side view of the die 825. In some examples, the fabrication system forms the EMC layer on the entirety of the wafer 810 including in each of the dies in dies 820. EMC dispensed on the side 630 forms an EMC layer 855 that includes the EMC 850 and the copper pillars 740. In some examples, the EMC layer 850 has a thickness 860 between a first side of the EMC layer, side 830, and a second side of the EMC layer, side 835. In some examples, the value of the thickness 860 (e.g., ~200 microns) is at least two times a value of the thickness 515 (e.g., ~100 microns).

Additionally, in some examples, the EMC includes a first coefficient of thermal expansion (CTE) and a filler content level, where the filler content level provides mechanical stability to the optical package unit and subsequently formed optical platform/package as discussed herein. In one example, CTE of the EMC is in a range of 5-7 ppm which is similar to the CTE of silicon (~3 ppm). The fabrication system may adjust various properties in the fabrication process to prevent warpage of the various layers during fabrication. For example, the fabrication system may adjust moisture resistance, modulus of elasticity, and flowability via the filler content level. In some examples, the EMC is cured and cooled via mechanism that prevent warpage. Additionally, thermo-compression bonding is used to prevent further warpage of the EMC. In addition, thin film layers may deposited on back of the wafer and the RDL layer may also be used to counter balance a stress due to mold shrinkage.

Figure 9A:
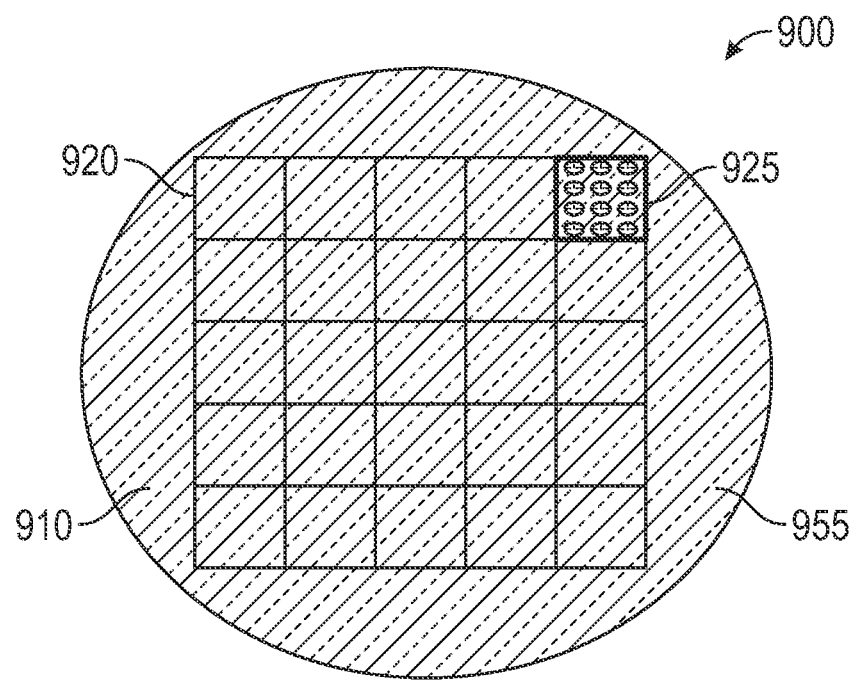
Figure 9B:
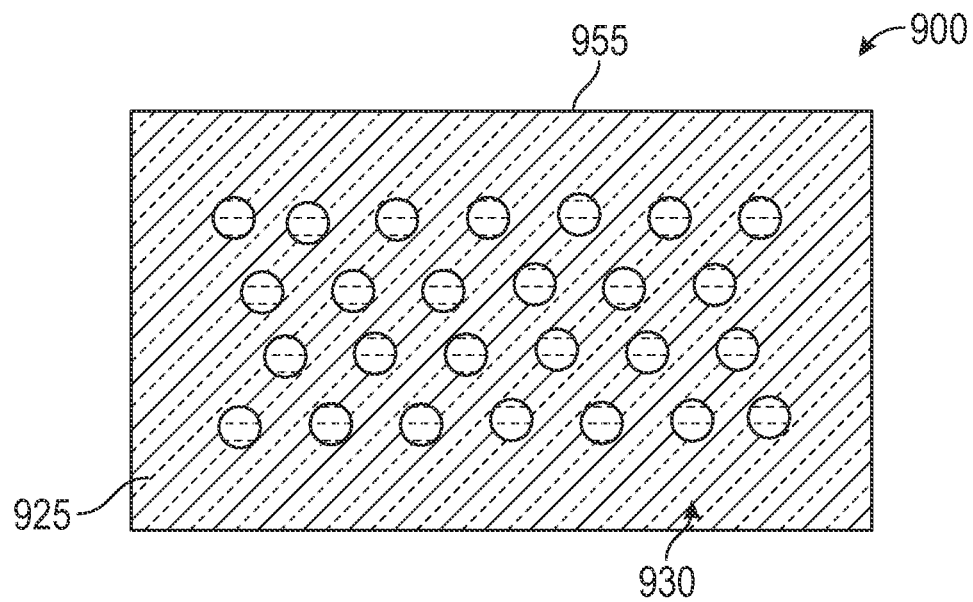
Figure 9C:
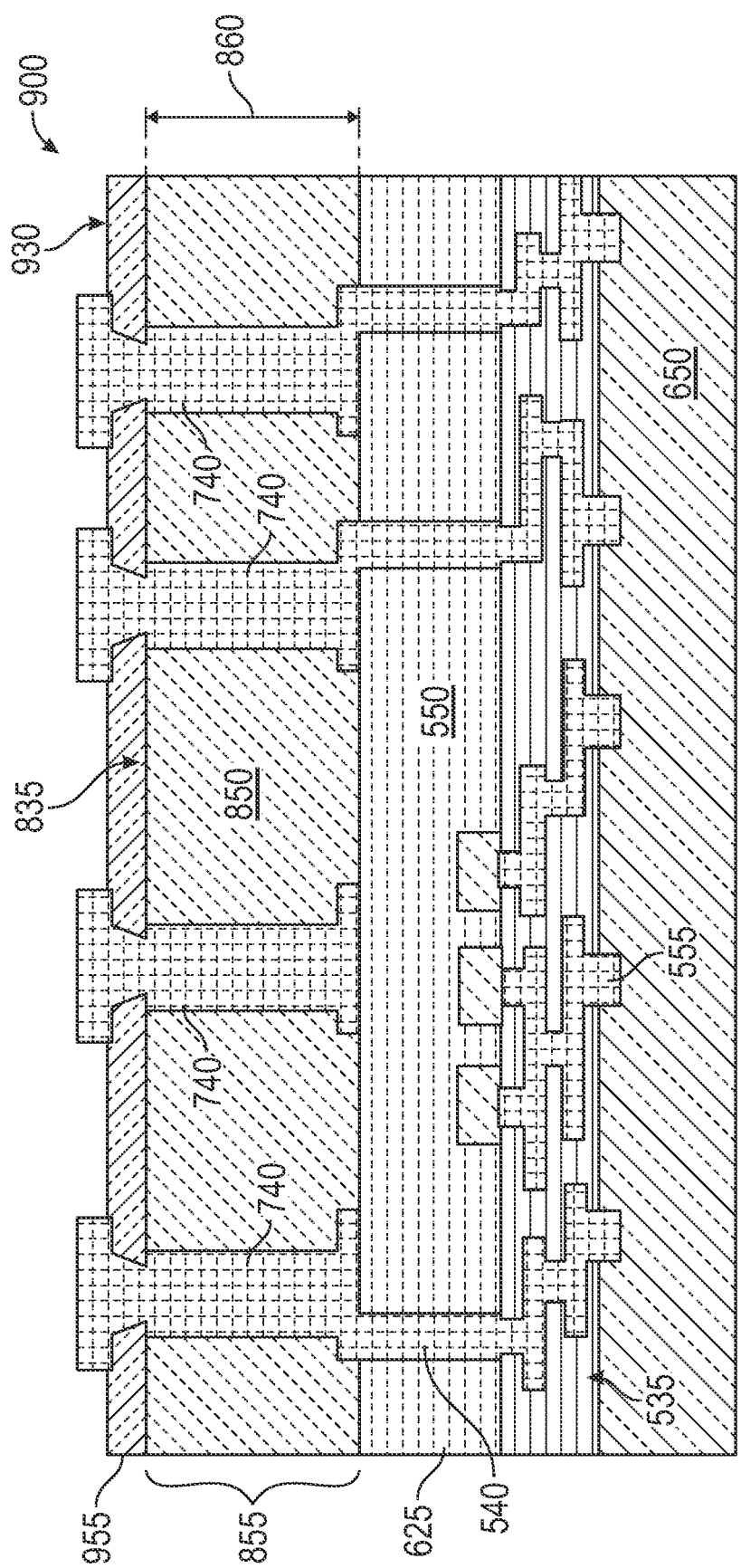

In some examples, the fabrication system further processes the wafer 810 as shown in step 900 and step 1000 in FIGS. 9A-10B. For example, as shown in FIGS. 9A-9C, the fabrication system performs backside passivation processes to form a passivation layer 955 on the side 835 of the EMC layer 855. FIG. 9A is a top view of the wafer 910 which includes the passivation layer 955, dies 920, and die 925, FIG. 9B, is a top view of the die 925 including the passivation layer 955 and FIG. 9C is a side view of the die 925. The passivation layer 955 includes a side 930.

Figure 10A:
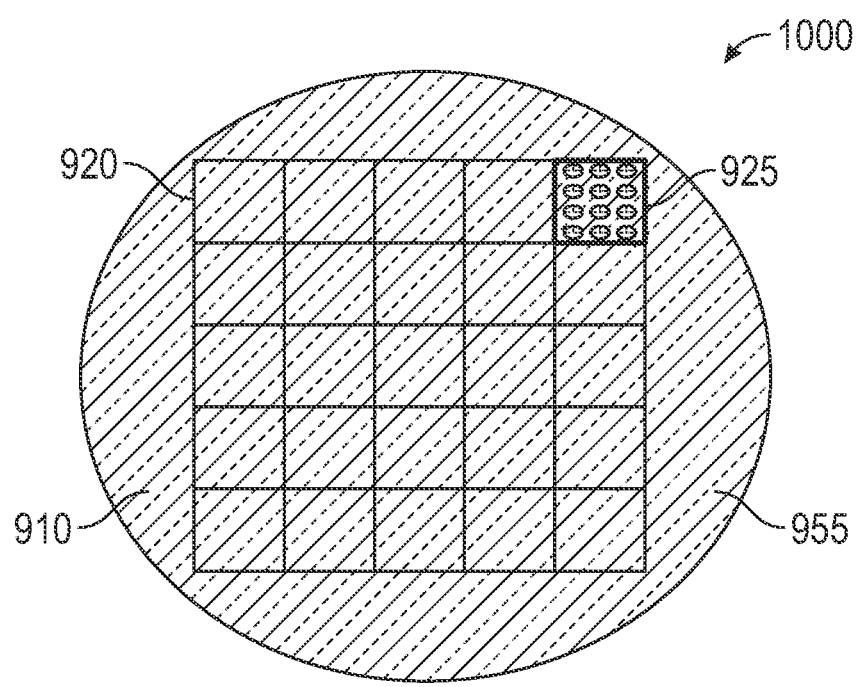
Figure 10B:
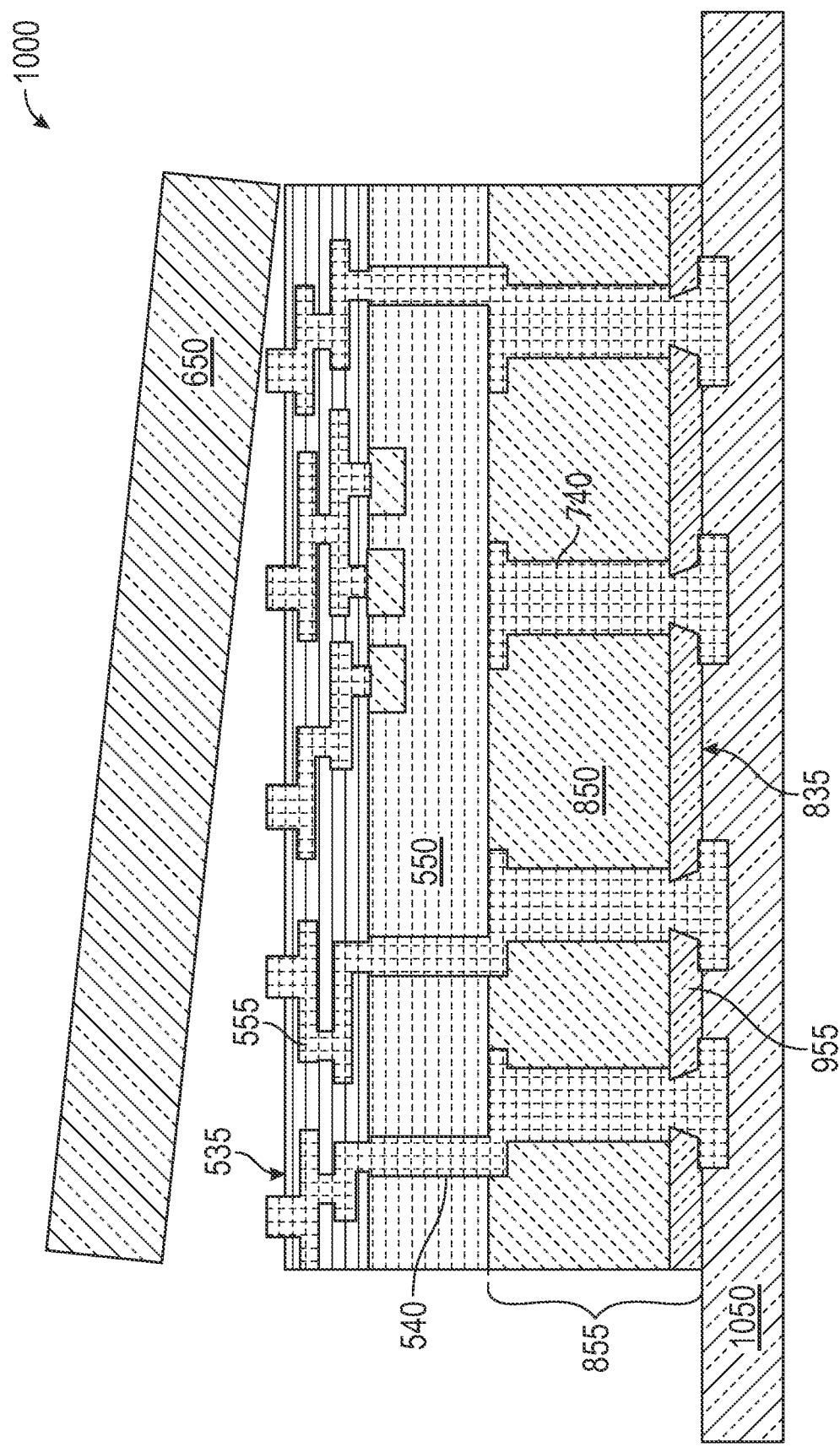

At step 1000 in FIG. 10A and FIG. 10B, the fabrication system attaches the wafer 910 to a carrier tape and removes the carrier wafer. FIG. 10A is a top view of the wafer 910 flipped from the perspective shown in FIG. 9A. FIG. 10B is a side view of the die 925 flipped from the perspective shown in FIG. 10A. The fabrication system attaches the side 835 of the wafer 910 to a carrier tape 1050 and removes the carrier wafer 650.

At block 320, the fabrication system determines when a thermal barrier is desired on an optical package unit on the in process wafer. For example, a device attached to a unit described herein may include a thermal barrier to thermally isolate the device from the other components of the optical package unit. In some examples, the fabrication system forms a thermal barrier layer at block 325. The fabrication system may also form a third plurality of conductive paths on the first side of the interposer layer and dispense the EMC on the first side of the interposer layer and about the third plurality of conductive paths to form a thermal barrier layer. In some examples, the fabrication system also attaches a device to a first side of the thermal barrier layer as shown in step 1100 of FIGS. 11A-C.

Figure 11A:
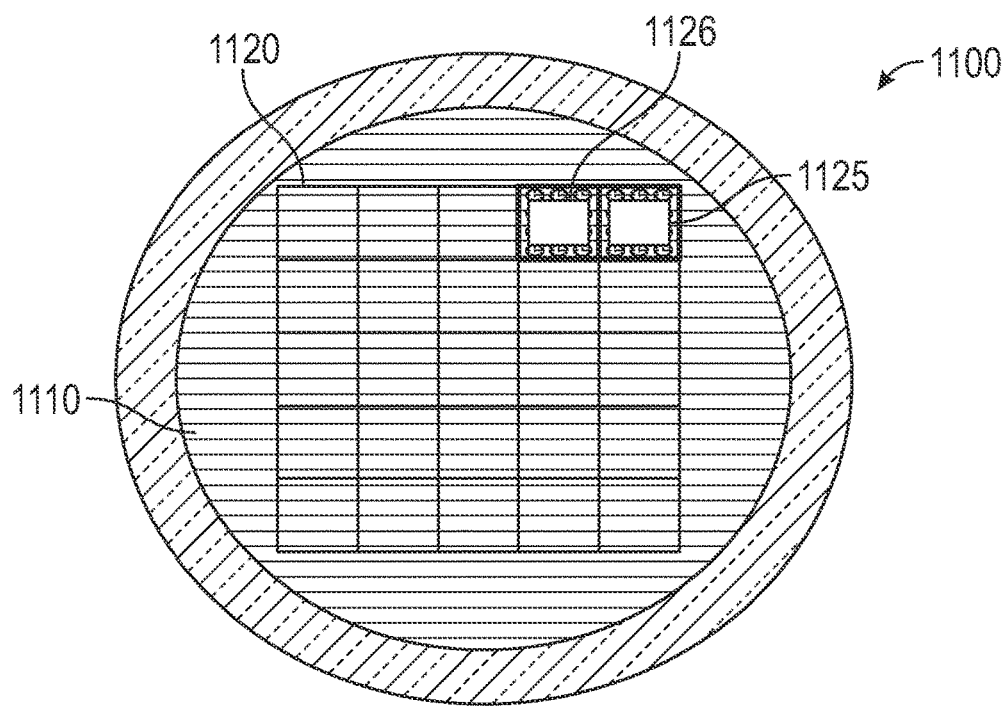
Figure 11B:
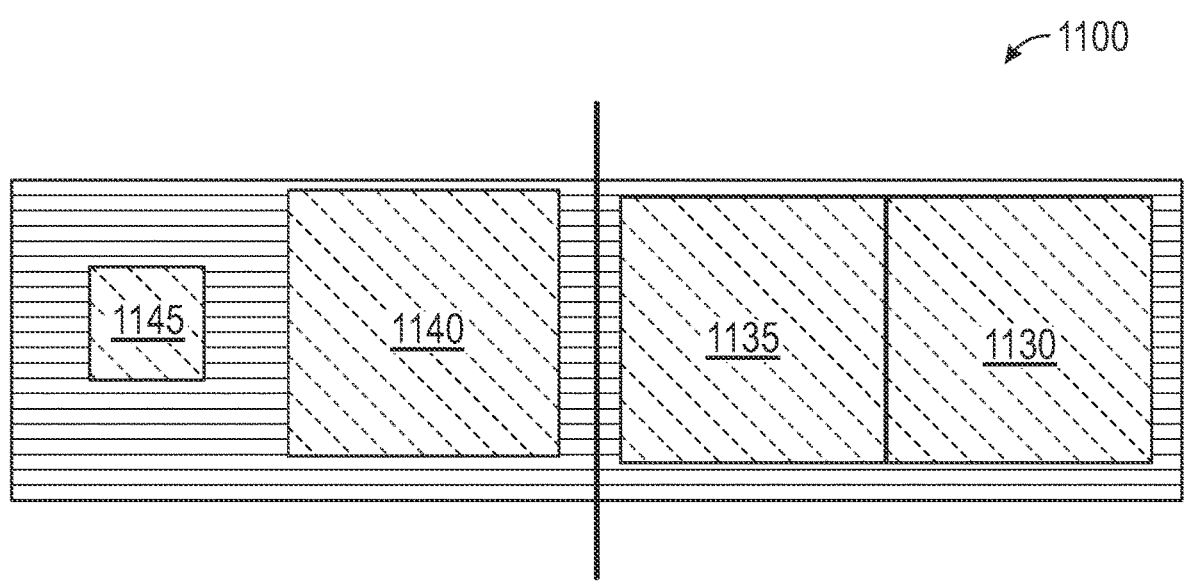
Figure 12:
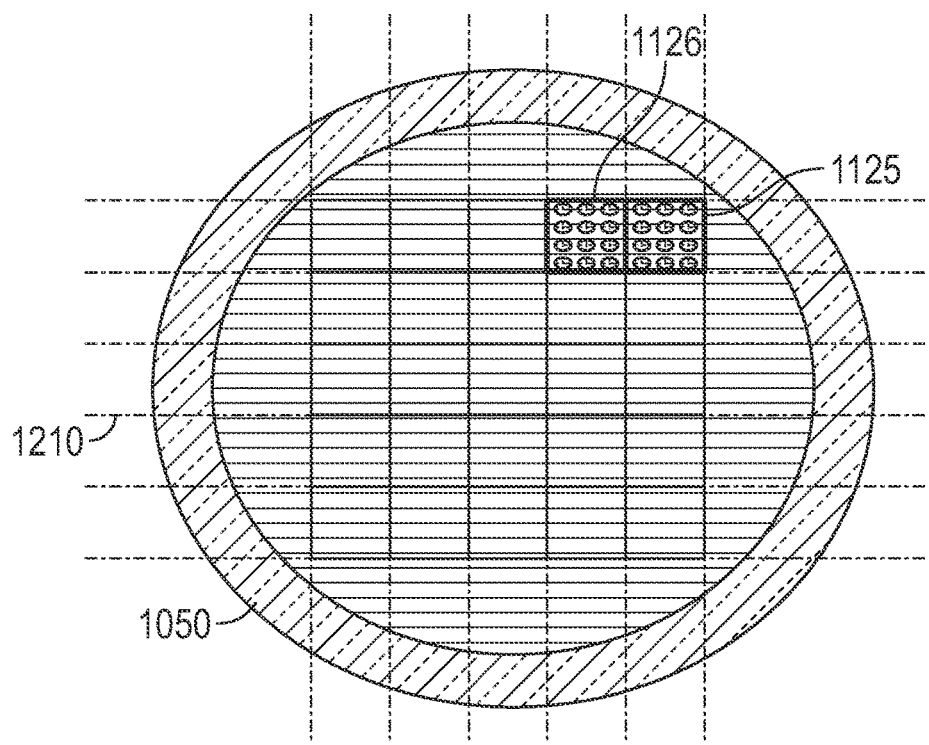
Figure 13:
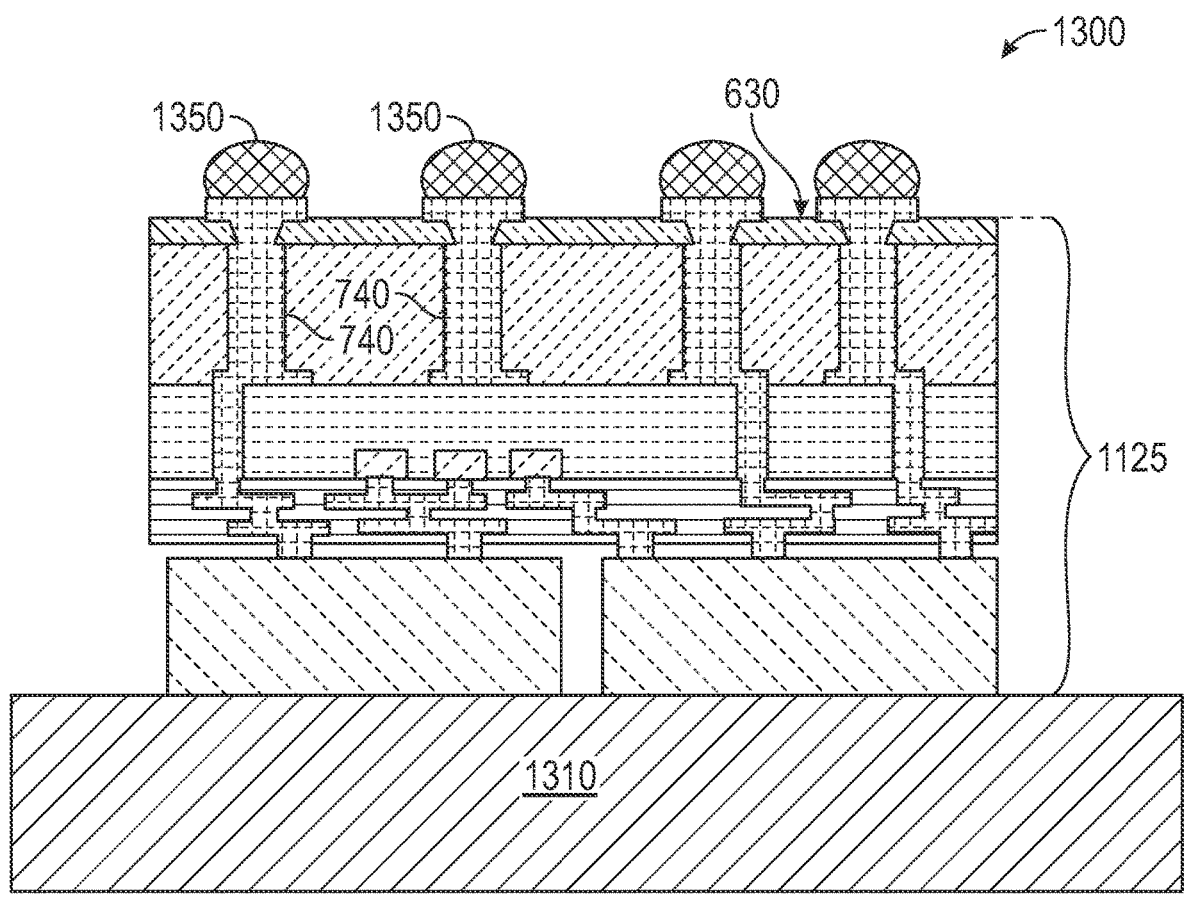

FIG. 11A is a top view of the wafer 1110 which includes attached devices as described herein on dies 1120, including individual dies 1125 and 1126, FIG. 11B is a top view of the individual dies 1125 and 1126, and FIG. 11C is a side view of the individual dies 1125 and 1126. In some examples, the fabrication system forms the copper pillars 1150 on the first side 535 and dispenses EMC about the copper pillars 1150 to form a thermal barrier layer 1155 with the EMC and copper pillars 1150. In some examples, the third plurality of conductive paths, i.e., the copper pillars 1150 provides a communication path from a die or attached device to the first plurality of conductive paths such as the TSVs 540. In some examples, the thermal barrier layer 1155 provides a thermal barrier between a device/die attached to side 1156 of the thermal barrier layer 1155 and the interposer layer 550 as described in more detail above in relation to FIG. 2.

Returning back to FIG. 3, at block 330 the fabrication system attaches at least one device to the first side of the interposer layer. For example, the fabrication system attaches the devices 1130, 1135, and 1140 to the first side 535 of the interposer layer 550 and the device 1145 to the side 1156 of the thermal barrier layer 1155. In some examples, the devices are CPO component or other similar devices. In some examples, the devices 1130, 1135, and 1140 are communicatively coupled to at least one path of the first plurality of conductive paths such as the TSVs 540 via interconnects 555. In some examples, the EMC layer 855 and the copper pillars 740 also provides for thermal dissipation for heat generated by the devices 1130, 1135, and 1140 and the interposer layer as well as thermal isolation between the interposer layer 550 and the side 630.

At block 330 the fabrication system dices the wafer to form an optical package unit. In some examples, the optical package unit includes a diced smooth facet surface for optical component connection. For example, the fabrication system dices the dies 1120 into individual dies, such as the individual dies 1125 and 1126. In some examples, the fabrication system utilizes a first dicing process in the interposer layer of the wafer to provide a smooth dicing cut through the interposer layer and utilizes a second dicing process through the EMC layer to provide a smooth dicing cut through the EMC layer.

For example, along a dicing seam 1180 the fabrication system uses a first dicing process optimized for dicing silicon interposer layers (e.g., SiPH) from the first side 535 to a depth 1185. From the depth 1185 to the carrier tape 1050, the fabrication system uses a second dicing process, different from the first process, where the second process is optimized for dicing EMC layers. In some examples, a dicing blade does not cut through dis-similar materials (silicon and EMC) in the direction of travel and two blade dicing is used (e.g., one blade to cut through silicon and the other blade to cut through molding). In some, stealth dicing is possible by removing the mold material using partial cut (controlled depth touching the silicon) though the molding material followed by stealth dicing by laser. The use of the dual process for the different layers provides a smooth facet surface 1190 which enables optical edge couple to the smooth facet surface 1190 with little optical signal loss. Dicing the wafer forms a diced wafer 1210 shown in a top view of the wafer 1210 in FIG. 12.

At block 335, the fabrication system forms an optical package unit with a diced smooth facet surface. For example, the fabrication system using pick and place processes picks a die, such as the individual die 1125 from the wafer 1210 and attaches the individual die 1125 to a structure 1310 for processing as shown in a side view of the individual die 1125 in step 1300 of FIG. 13. In some examples, the structure 1310 includes a Joint Electron Device Engineering Council (JEDEC) tray or other similar processing structure. The fabrication system attaches connection points, such as solders 1350 on the side 630 to the second side of the EMC layer, side 630, using under-bump metallization (UBM). In some examples, the solder 1350 is formed on and connected to the copper pillars 740.

Figure 14:
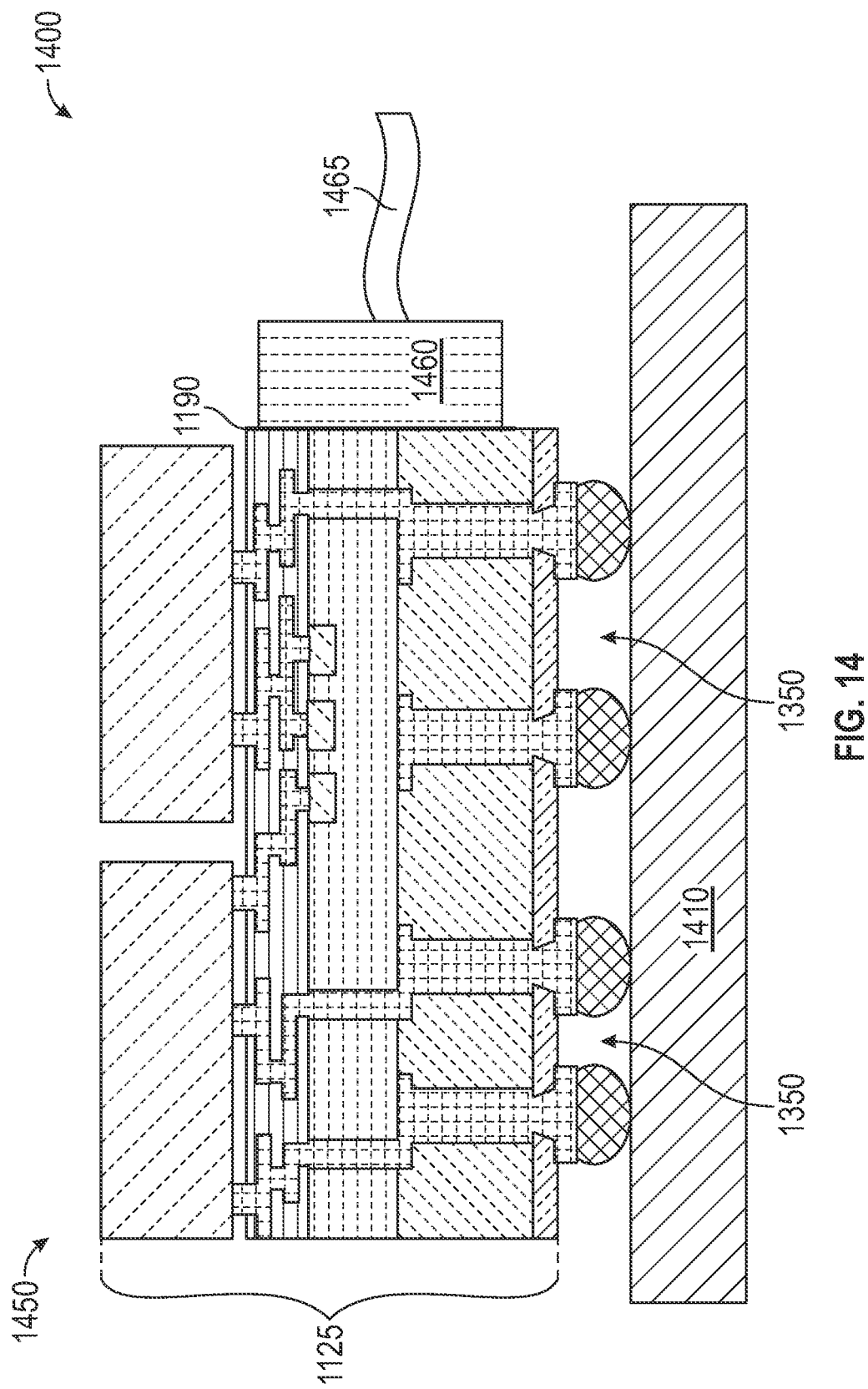

In some examples, at step 1400 in FIG. 14, the fabrication system further processes the individual die 1125 by connecting the optical package unit, individual die 1125, to a substrate via the connection points. For example, the fabrication system attached the individual die 1125 to the substrate 1410 via the solders 1350 to form an optical package 1450. In some examples, the optical package 1450 is an optical package platform similar to the optical package 100 and the individual die is similar to the optical platform 101, both described in relation to FIG. 1.

In some examples, at block 340, the fabrication system attaches an FAU to the diced smooth facet surface of the optical package unit, where the FAU is communicatively coupled to the optical package unit. For example, the fabrication system attaches FAU 1460 to the optical package 1450 providing communication from the optical package 1450 to connected fibers 1465. As described above, the optical package 1450 provides a mechanical stable optical package for CPO components and large I/O components during the use of the optical package 1450.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The flowchart and block diagrams in the Figs. illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical platform comprising:
    a first layer positioned on a substrate and comprising a first thickness from a first side of the first layer adjacent to the substrate to a second side of the first layer;
    a first plurality of conductive paths formed in the first layer;
    a second layer positioned on the first layer and comprising a second thickness from a first side of the second layer adjacent to the second side of the first layer to a second side of the second layer, where the first thickness is greater than the second thickness, where the first thickness and the second thickness provide a combined mechanical coupling thickness for an optical connection component on an facet edge side of the first layer and the second layer; and
    a second plurality of conductive paths formed through the second layer, where the second plurality of conductive paths provides communication paths from the second side of the second layer to the first plurality of conductive paths,
    wherein the facet edge side comprises a diced smooth facet surface, and wherein the optical platform further comprises a fiber array unit (FAU) removably or permanently attached to the facet edge side, wherein the FAU is communicatively coupled to the second layer.

2. The optical platform of claim 1, further comprising:
    at least one device positioned on the second side of the second layer, wherein the at least one device is communicatively coupled to at least one path of the second plurality of conductive paths.

3. The optical platform of claim 2, wherein the first layer and the first plurality of conductive paths provides a thermal dissipation for heat generated by the at least one device and the second layer.

4. The optical platform of claim 1, further comprising:
    a third layer positioned on the second layer and comprising a third thickness from a first side of the third layer adjacent to the second side of the first layer to a second side of the third layer;
    a device positioned on the second side of the third layer; and
    a third plurality of conductive paths formed through the third layer, where the third plurality of conductive paths provides a communication path from the device to the second plurality of conductive paths, wherein the third layer provides a thermal barrier between the device and the second layer.

5. The optical platform of claim 1, wherein the first thickness comprises a value that is at least two times a value of the second thickness.

6. The optical platform of claim 1, wherein the first layer is formed from an electronic mold compound (EMC), wherein the EMC comprises a first coefficient of thermal expansion (CTE) and filler content level, and wherein the first plurality of conductive paths comprises a plurality of copper pillars.

7. The optical platform of claim 1, wherein the second layer comprises a silicon interposer, wherein the second plurality of conductive paths comprises through silicon vias (TSVs).

8. A method comprising:
    processing a silicon layer on a wafer to form an interposer layer for an optical package, where the interposer layer comprises a first plurality of conductive paths, where the interposer layer comprises a first thickness between a first side of the interposer layer and a second side of the interposer layer;
    forming a second plurality of conductive paths on the second side of the interposer layer;
    dispensing an electronic mold compound (EMC) on the second side of the interposer layer and around the second plurality of conductive paths to form an EMC layer on the wafer, where the EMC layer comprises a second thickness between a first side of the EMC layer and a second side of the EMC layer; and
    dicing the wafer to form an optical package unit comprising a diced smooth facet surface for optical component connection.

9. The method of claim 8, wherein the first plurality of conductive paths comprises a plurality of through silicon vias (TSVs), and wherein processing the silicon layer to form the interposer layer comprises:
    forming the plurality of TSVs in the silicon layer; and
    processing the silicon layer using back-end-of-line processes to form microbump interconnects on a first side of the interposer layer.

10. The method of claim 8, wherein the second plurality of conductive paths comprises a plurality of copper pillars, wherein forming the second plurality of conductive paths comprises forming the plurality of copper pillars using tall copper plating processes.

11. The method of claim 8, wherein dicing the wafer comprises:
utilizing a first dicing process in the interposer layer of the wafer to provide a smooth dicing cut through the interposer layer; and
utilizing a second dicing process through the EMC layer to provide a smooth dicing cut through the EMC layer.

12. The method of claim 8, further comprising:
attaching at least one device to the first side of the interposer layer, wherein the at least one device is communicatively coupled to at least one path of the first plurality of conductive paths, wherein the EMC layer and the second plurality of conductive paths provides for thermal dissipation for heat generated by the at least one device and the interposer layer.

13. The method of claim 8, further comprising:
attaching a fiber array unit (FAU) to the diced smooth facet surface of the optical package unit, wherein the FAU is communicatively coupled to the optical package unit.

14. The method of claim 8, further comprising:
forming a third plurality of conductive paths on the first side of the interposer layer;
dispensing the EMC on the first side of the interposer layer and about the third plurality of conductive paths to form a thermal barrier layer; and
attaching a device to a first side of the thermal barrier layer, wherein the third plurality of conductive paths provides a communication path from the device to the first plurality of conductive paths, wherein the thermal barrier layer provides a thermal barrier between the device and the interposer layer.

15. The method of claim 8, further comprising:
attaching connection points to the second side of the EMC layer; and
connecting the optical package unit to a substrate via the connection points.

16. The method of claim 8, wherein the second thickness comprises a value that is at least two times a value of the first thickness.

17. The method of claim 8, wherein the EMC comprises a first coefficient of thermal expansion (CTE) and a filler content level, wherein the filler content level provides mechanical stability to the optical package unit.

18. An optical package comprising:
an electronic mold compound (EMC) layer positioned on a substrate and comprising a first thickness from a first side of the EMC layer adjacent to the substrate to a second side of the EMC layer;
a plurality of conductive pillars formed through the EMC layer;
a silicon interposer layer positioned on the EMC layer and comprising a second thickness from a first side of the silicon interposer layer adjacent to the second side of the EMC layer to a second side of the silicon interposer layer;
at least one optical device attached to the silicon interposer layer; and
a plurality of TSVs formed through the silicon interposer layer, where the plurality of TSVs provides communication paths through the optical package for the at least one optical device.

19. The optical package of claim 18, wherein the first thickness and the second thickness provide a combined mechanical coupling thickness for a connection component on a connection side of the EMC layer and the silicon interposer layer, wherein the connection side comprises a diced smooth facet surface, and wherein the optical package further comprises a fiber array unit (FAU) removably attached to the connection side, wherein the FAU is communicatively coupled to the silicon interposer layer.

* * * * *